United States Patent [19]

Lam

[11] Patent Number: 5,640,328
[45] Date of Patent: Jun. 17, 1997

[54] METHOD FOR ELECTRIC LEAF CELL CIRCUIT PLACEMENT AND TIMING DETERMINATION

[76] Inventor: Jimmy Kwok-Ching Lam, 10178 Alpine Dr. #1, Cupertino, Calif. 95014

[21] Appl. No.: 232,960

[22] Filed: Apr. 25, 1994

[51] Int. Cl.⁶ .......................... G06F 17/50; G06F 11/26
[52] U.S. Cl. ........................ 364/489; 364/488; 364/490
[58] Field of Search .................................. 364/578, 488, 364/489; 395/500, 550, 650

[56] References Cited

U.S. PATENT DOCUMENTS

| | | | |
|---|---|---|---|
| 4,827,428 | 5/1989 | Dunlop et al. | 364/491 |
| 5,095,454 | 3/1992 | Huang | 364/578 |
| 5,305,229 | 4/1994 | Dhan | 364/489 |
| 5,331,568 | 7/1994 | Pixley | 364/489 |
| 5,353,433 | 10/1994 | Sherman | 395/550 |
| 5,371,683 | 12/1994 | Fukazawa et al. | 364/489 |
| 5,379,231 | 1/1995 | Pillage et al. | 364/488 |
| 5,461,573 | 10/1995 | Chakradhar et al. | 364/489 |
| 5,469,369 | 11/1995 | Puri et al. | 364/489 |
| 5,475,608 | 12/1995 | Apte et al. | 364/489 |

OTHER PUBLICATIONS

"Symbolic Manipulation of Boolean Functions Using a Graphical Representation" by Randal E. Bryant, Carnegie-Mellon University, Dept. of Computer Science, for the 22nd Design Automation Conference, 1985 IEEE, Paper 42.1, pp. 688–694.

"Delay Computation in Switch-Level Models of Non-Tree-like MOS Circuits" by Denis Martin and Nicholas C. Rumin, Department of Electrical Engineering, McGill University, 1988 IEEE, pp. 358–361.

"Computing Signal Delay in General RC Networks by Tree/Link Partitioning" by Pak K. Chan and Kevin Karplus, Computer Engineering, University of California —Santa Cruz, for the 26th ACM/IEEE Design Automation Conference, 1989 ACM, Paper 31.1, pp. 485–490.

"Worst–Case Delay Estimation of Transitor Groups" by Serge Gaiotti, Michel R. Dagenais and Nicholas C. Rumin, Dept. of Electrical Engineering, McGill University, for the 26th ACM/IEEE Design Automation Conference, 1989 ACM, Paper 31.2, pp. 491–496.

"ILLIADS: A New Fast MOS Timing Simulator Using Direct Equation–Solving Approach" by Y.H. Shih and S.M. Kang, Coordinated Science Laboratory, University of Illinois, for the 28th ACM/IEEE Design Automation Conference, 1991 ACM, Paper 2.1, pp. 20–25.

Primary Examiner—Kevin J. Teska
Assistant Examiner—Thai Phan
Attorney, Agent, or Firm—Oblon, Spivak, McClelland, Maier & Neustadt, P.C.

[57] ABSTRACT

A method for determining the location of electric leaf cell circuits within the architecture of a semiconductor chip includes determination of the longest signal delays through an electric leaf cell circuit by evaluating independent channel connected components, reorganizing the circuit elements of each channel under evaluation into acyclic form, restructuring the acyclic form of channel connected components within the electric leaf cell circuits being structurally positioned in the chip architecture by selected reduction processes, determining input state vectors for each input and output pin connection pair of the electric leaf cell circuit in which an input pin connection state change is reflected in an output connection pin state change, and determining placement of the leaf cell within a semiconductor circuit module with reference to the greatest delay within each leaf cell.

2 Claims, 19 Drawing Sheets

| QN=0 | CD | D | CP | SD | S1 | S2 |
|---|---|---|---|---|---|---|
| | 0 | 0 | 0 | 0 | 1 | 0 |
| | 0 | 0 | 0 | 1 | 1 | 1 |
| | 0 | 0 | 1 | 0 | 1 | 1 |
| | 0 | 0 | 1 | 1 | 1 | 1 |
| | 0 | 1 | 0 | 0 | 1 | 1 |
| | 0 | 1 | 0 | 1 | 1 | 1 |
| | 0 | 1 | 1 | 0 | 1 | 1 |
| | 0 | 1 | 1 | 1 | 1 | 1 |

FIGURE 8a

| QN=1 | CD | D | CP | SD | S1 | S2 |
|---|---|---|---|---|---|---|
| | 1 | 0 | 0 | 0 | 0 | 0 |
| | 1 | 0 | 0 | 1 | 0 | 0 |
| | 1 | 0 | 1 | 0 | 0 | 0 |
| | 1 | 0 | 1 | 1 | 0 | 0 |
| | 1 | 1 | 0 | 0 | 0 | 0 |
| | 1 | 1 | 0 | 1 | 0 | 0 |
| | 1 | 1 | 1 | 0 | 0 | 0 |
| | 1 | 1 | 1 | 1 | 0 | 0 |

FIGURE 8b

| QN=0 | CD | D | CP | SD | $S_1$ | $S_2$ |
|---|---|---|---|---|---|---|
|  | 0 | 0 | 0 | 0 | 1 | 0 |

FIGURE 8c

| QN=1 | CD | D | CP | SD | $S_1$ | $S_2$ |
|---|---|---|---|---|---|---|
|  | 0 | 0 | 1 | 0 | 0 | 0 |

FIGURE 8d

| A | A·H | A·L |
|---|---|---|
| 0 | 0 | 1 |
| 1 | 1 | 0 |
| X | 1 | 1 |
| Z | 0 | 0 |

FIGURE 16a

| OPERATION | LOGIC STATEMENT | TERTIARY EXPRESSIONS |
|---|---|---|
| NOT | B=$\underline{A}$ | B·L=A·H  B·H=A·L |
| AND | C=A·B | C·H=A·H·B·H |
|  |  | C·L=A·L+B·L |
| OR | C=A+B | C·H=A·H+B·H |
|  |  | C·L=A·L·B·L |

METHOD FOR ELECTRIC LEAF CELL CIRCUIT PLACEMENT AND TIMING DETERMINATION

TECHNICAL FIELD

The field of the present invention is delay characterization of electric circuits, and particularly delay characterization of electric leaf cell circuitry to enable determination of leaf cell placement within circuit blocks to be fabricated in semiconductor chips.

BACKGROUND OF THE INVENTION

Circuitry in state-of-the-art semiconductor chips may be organized into selected regions, blocks or modules containing transistors and other circuit components, such as diodes, resistors, and capacitors, for example. The modules may be separated by channels through which electric wires pass between electric terminations or pins in the modules. The electric wires may be routed through the channels and over or under the modules themselves in separate layers, depending upon the design rules followed by the particular semiconductor chip. Intermediate levels of organization in the modules may include the use of standard cells, for example. In such standard cells, the design and its components are specifically predetermined, and, thus, the circuit characteristics, such as delay times for propagation of a signal through the particular standard cell are well known. Transistors and circuit components may also be organized into non-standard or custom cells which can be referred to as "leaf cells." This terminology is used in the semiconductor industry by analogy to how a tree grows from its trunk into branches and ultimately into leaves, at which photosynthesis takes place. Similarly, the basic circuit chip includes circuitry (the tree) which includes modules (the branches) which are organized into leaf cells (the leaves) which perform circuit activities. Simply stated, the leaf cells are at the lowest level of circuit organization above the transistors and other basic circuit elements. The standard cells themselves can be considered to be leaf cells as well.

The placement of leaf cells within electric circuit modules to be fabricated in semiconductor chips is dependent upon the capacitance between leaf cells connected by electric circuit wires and upon the actual worst case delay of signal propagation through particular leaf cells. The capacitance between particular pins on leaf cells to be connected is a function of the length of the connecting wire as well as its per-unit capacitance. Such capacitance can be determined in conventional manner, but there is wide variation between different kinds of leaf cells in terms of actual signal delays through the particular custom circuitry designed into the leaf cell.

The determination of leaf cell delays supports transistor level timing-driven place and route operations pursued in the course of developing a semiconductor chip to be fabricated. In standard cells and gate arrays, the delays between inputs and outputs of a particular group of transistors is precharacterized and delay expressions are readily available, permitting completion of design operations leading to chip manufacture without extensive engineering efforts or without suffering considerable design errors.

Existing approaches for transistor level place and route operations depend upon representation of the electric circuitry for delay determination with a simple resistor and capacitor network, for example. Such an approach is not sensitive to input and state conditions and patterns occurring in the actual electric circuitry in particular leaf cells.

SUMMARY OF THE INVENTION

According to the present invention, delay characterization of electric circuits in leaf cells of a semiconductor chip circuit arrangement is accomplished by assessment of the particular circuit connectivity of elements and components within a particular leaf cell. This includes determination of channel connected components within a selected leaf cell. Then, the particular channel connected components are reduced for a selected leaf cell. A particular leaf cell may include one or more feedback paths. To enable evaluation of delay times along a particular path, the feedback path is opened and state variables are inserted at the particular open loop points. The state variables inserted are equal to each other. By opening the feedback loops, an acyclic graph is established, representative of the electric circuitry of the leaf cell. Further according to the present invention, sets of input state vectors are determined for each pair of input output pins such that if that input changes its value from either 0 to 1 or from 1 to 0, that output will also change its value from 1 to 0 or 0 to 1 as applicable. This is done in accordance with the present invention by constructing one or more binary decision diagrams (BDD's) to represent the function of a selected leaf cell. One or more BDD is constructed so that output state changes occur in response to particular input vector changes. Then, the binary decision diagram is searched to find a set of valid input state patterns for selected pairs of input and output pins, such that an input change is reflected in an output change. Selection among the valid input state patterns to determine the longest (i.e., worst) delay for a particular input and output pin pair is accomplished by performance of a coarse timing simulation. Once the longest delay has been established by the coarse timing simulation, a precision determination of an accurate worst case timing value is made. Finally, to obtain a timing representation of the leaf cell and related electrical connection wires, the accurate worst case timing value is identified to obtain a linear delay wire expression as a function of loading capacitance. The approach according to the present invention is effective in characterizing both combinatorial and sequential logic circuits, without precharacterized cell and predetermined input state patterns. Delay characterization results are speedily obtained based upon connectivity and transistor size information, without the time and effort required currently according to conventional approaches to obtain the same or comparable results, thereby reducing the length of the overall circuit design and fabrication process involved in semiconductor manufacturing efforts.

BRIEF DESCRIPTION OF THE DRAWINGS

FIGS. 8a and 8b are respective tabular representations setting forth input state patterns for selected pairs of input output pins such that if a selected input value CD changes its value from either 0 to 1 or 1 to 0, a selected output pin, in this case, output pin QN, will also change its value, subject to the constraint that the other inputs stay constant between FIGS. 8a and 8b;

FIGS. 8c and 8d are respective tabular representations setting forth input state patterns for selected pairs of input output pins such that if a selected input value CP changes its value from either 0 to 1 or 1 to 0, a selected output pin, in this case, output pin QN, will also change its value;

FIG. 16a shows the tertiary representations of the states of a variable A including 0, 1, X, and Z;

FIG. 16b shows a table of rules of reduction and the names of the reduction operators representing the particular reduction operation expressed, in particular showing features of reduction operators, AND, OR, and NOT;

DETAILED DESCRIPTION OF THE PREFERRED EMBODIMENTS

Figure 1:
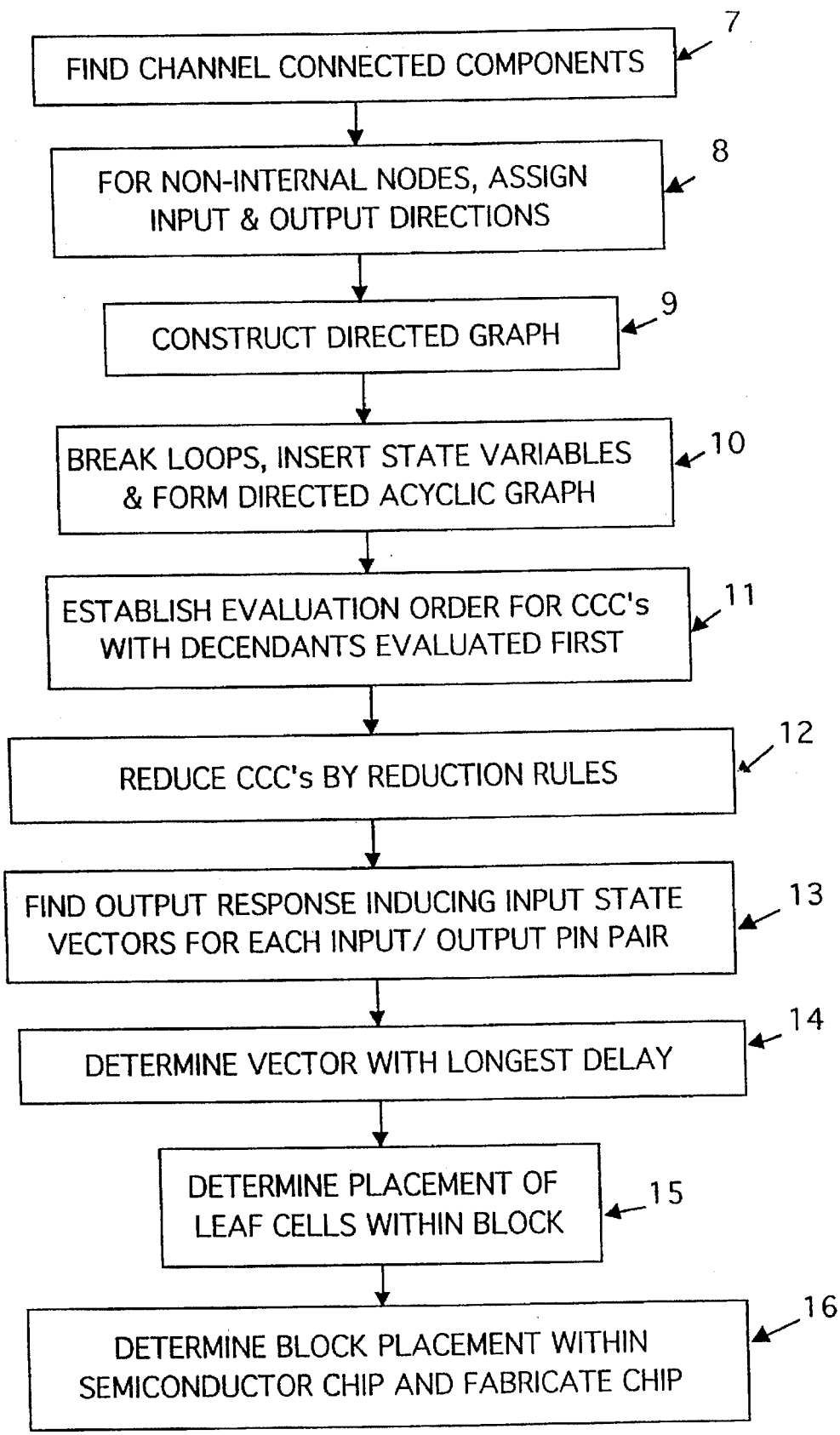
FIG. 1 shows a flow chart of a method according to the present invention directed toward delay characterization of electric circuits in leaf cells of a semiconductor chip circuit arrangement.

FIG. 1 shows a flow chart of a method according to the present invention directed toward delay characterization of electric circuits in leaf cells of a semiconductor chip circuit arrangement, which is accomplished by assessment of the particular circuit connectivity of elements and components within a particular leaf cell. This includes determination of channel connected components within each leaf cell, as expressly stated at step 7 of FIG. 1. Next, for all internal nodes of the electric circuitry of a particular set of channel connected components within a selected leaf cell, input and output directions are assigned 8. Additionally, a directed graph is established 9, setting forth the channel connected components within a leaf cell. Then, the particular channel connected components for a selected leak cell are reduced. A particular leaf cell may include one or more feedback paths. To enable evaluation of delay times along a particular path, the feedback path is opened and state variables are inserted 10 at the particular open loop points to represent circuit values equal to each other. By opening the feedback loops, an acyclic graph is established, representative of the electric circuitry of the leaf cell. Next, an evaluation order for channel connected components is established 11, with the descendant component of the circuit components of the leaf cell along the particular channel path being designated for priority evaluation. To enable evaluation, the channel connected components are reduced by parallel and series reduction techniques 12 to be discussed in greater detail below. Further according to the present invention, sets of input state vectors are determined 13 for each pair of input output pins such that if that input changes its value from either 0 to 1 or from 1 to 0, that output will also change its value from 1 to 0 or 0 to 1 as applicable. Step 13 refers to particular input state vectors, which if modified, will cause a particular output effect, particularly as to a selected input/ output pin pair, as will be discussed in greater detail below. This determination of which input state vectors have an output change affect is done in accordance with the present invention by constructing one or more binary decision diagrams (BDD's) to represent the function of a selected leaf cell. Then, the binary decision diagram is searched to find a set of valid patterns according to which output state changes occur in response to particular input vectors. A coarse timing simulation is performed for selecting among the valid patterns and particular input vectors to determine the longest (i.e., worst) delay 14 for a particular input and output pin pair. Once the longest delay has been established by the coarse timing simulation, a precision determination of an accurate worst case timing value is made. Finally, to obtain a timing representation of the leaf cell and related electrical connection wires, the accurate worst case timing value is associated with delay wire length variables and associated per unit capacitances to obtain a linear delay wire expression as a function of loading capacitance. The approach according to the present invention is effective in characterizing both combinatorial and sequential logic circuits, without precharacterized cell and predetermined input state patterns. Delay characterization results are speedily obtained based upon connectivity and transistor size information, without the time and effort required currently according to conventional approaches to obtain the same or comparable results, thereby reducing the length of the overall circuit design and fabrication process involved in semiconductor manufacturing efforts. Once the vector with the greatest delay has been established, the particular placement of leaf cells within circuit blocks or modules of the circuitry of a semiconductor chip can be established 15 according to well-known techniques in the semiconductor design arts. Once the placement of leaf cells within particular blocks has been determined, the location and placement of the blocks themselves can be determined 16, and progress directed toward actual chip fabrication can be accomplished.

Figure 2:
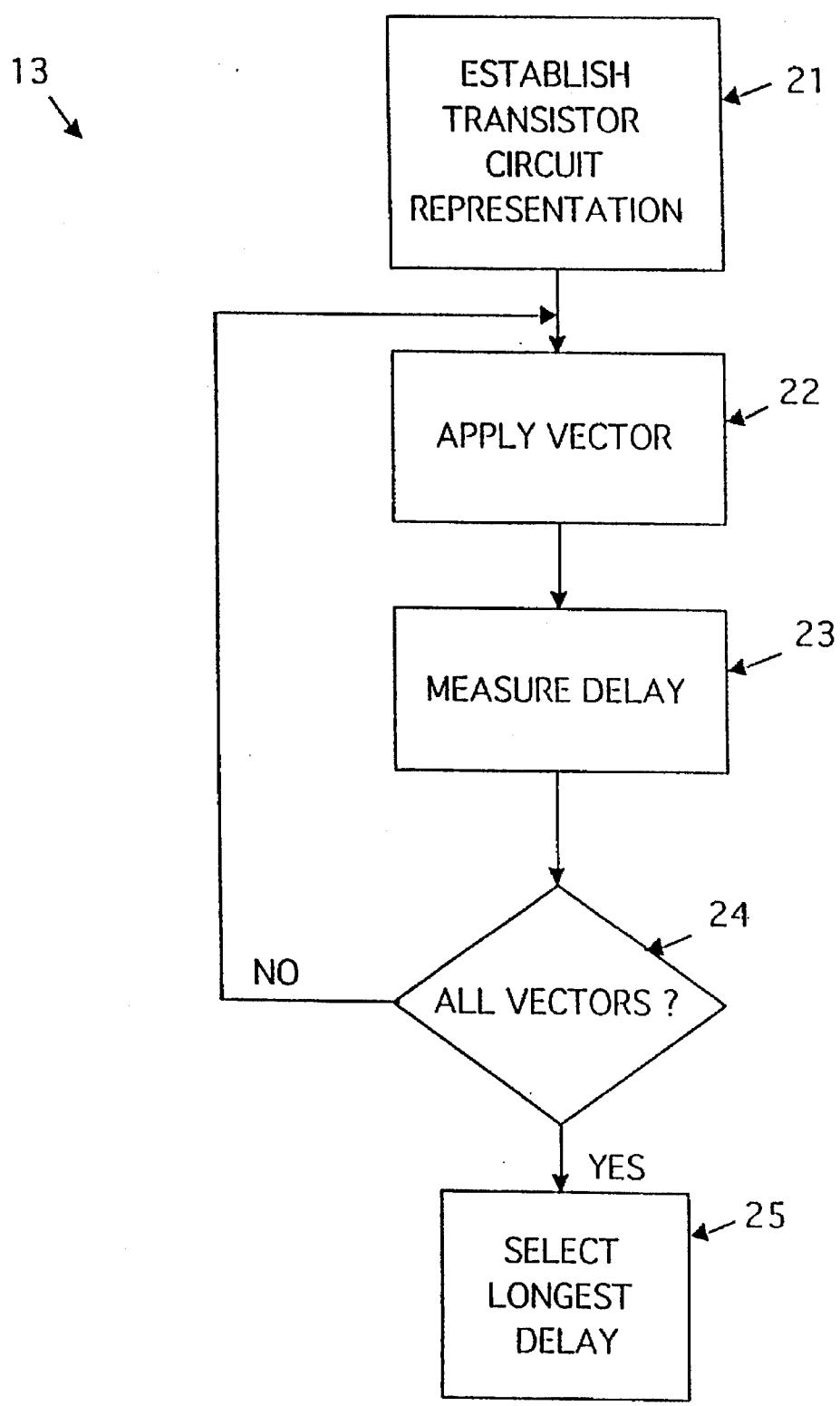
FIG. 2 shows a flow chart expressing details of the process of determining which of several input state vectors is representative of the longest delay for a particular input and output pin pair.

FIG. 2 shows a flow chart expressing details of the process of determining which of several live input state vectors is representative of the greatest delay along a particular leaf cell circuit channel path. First, a transistor circuit representation of a selected leaf cell circuit channel path is established 21. Next, a first in order or selected live input state vector is applied 22 to the transistor circuit representation. Next, according to decision step 24 of FIG. 2, a determination is made whether to continue with another live input state vector or not. In particular, according to one version of the present invention, if all the input state vectors for which an input change for a single input value causes an output change have been applied to the transistor circuit representation of the selected leaf cell circuit channel path, then the various delay results of the particular vectors are compared and a determination of the greatest delay and the corresponding vector causing the delay is determined, leading to a selection of the greatest delay 25. If not all other live input state vectors have been evaluated, then control continues with a repetition of step 22 to apply a next in order vector for delay determination.

Figure 3:
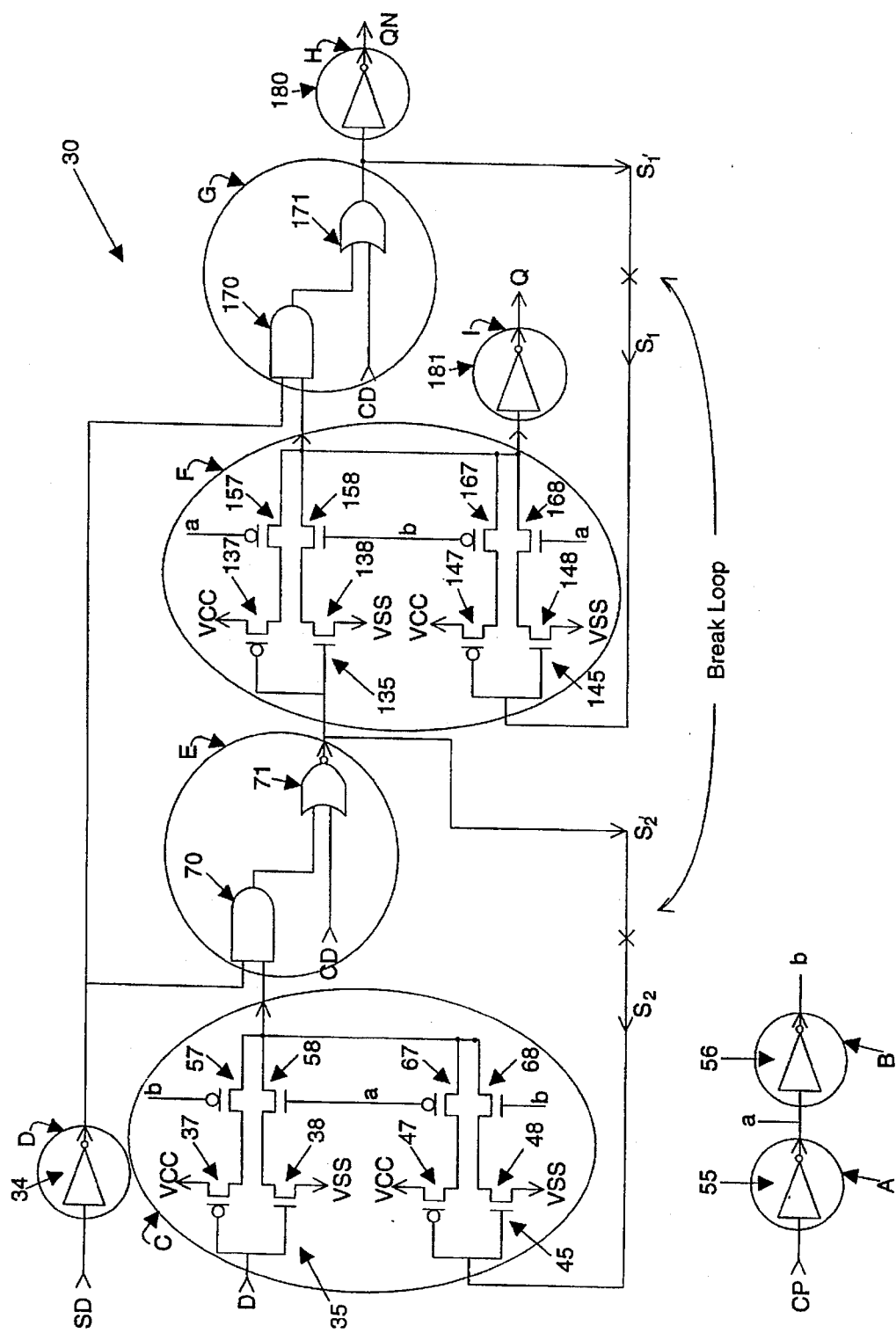
FIG. 3 shows channel connected components (CCC's) of a selected flip flop circuit comprising a selected leaf cell example.

FIG. 3 shows channel connected components (CCC's) of a selected flip flop circuit 30 comprising a selected leaf cell example. Flip flop circuit 30 includes the circuitry of channel connected component D including a first inverter 34 having an input, SD. First inverter 34 is additionally referred to as inverter D, for convenience, as inverter D is the only circuit element shown in channel region D of flip flop circuit 30. Flip flop circuit 30 includes a second inverter 35 in channel region C, including a p-channel transistor 37 connected at its source to VCC, and an n-channel transistor 38 connected to VSS at its source, the respective transistors having their input control gates connected to each other at a common input node D. Flip flop circuit 30 further includes inverter 45 including p-channel transistor 47 connected to VCC at its source, and n-channel transistor 48 connected to VSS at its source, the respective transistors having their input control gates connected to each other at a common input designated S2, as will be discussed in greater detail below. Flip flop circuit 30 further includes series inverters 55 and 56, the input connection for series inverter 55 being the value, CD, and the output of series inverter 55 being the value "a." Signal output values "a" and "b" having a controlling effect upon basic circuit elements of the channel region. The output of series inverter 55, i.e., "a," is connected to the input of series inverter 56. The output of series inverter 56 is the value, "b." Flip flop circuit 30 further includes a p-channel transistor 57 and n-channel transistor 58, as well as p-channel transistor 67 and n-channel transistor 68. P-channel transistor 57 is connected at its source to the drain of p-channel transistor 37, and the control gate of p-channel transistor 57 is connected to value "a," at the output of inverter 55. N-channel transistor 58 is connected at its source to the drain of n-channel transistor 38. The source of p-channel transistor 67 is connected to the drain of p-channel transistor 47, and the control gate of p-channel transistor 67 is connected to the value "a," at the output of inverter 55. The source of n-channel transistor 68 is connected to the drain of n-channel transistor 48, and the control gate of n-channel transistor 68 is connected to value "b," at the output of inverter 56. Further, the drains of p-channel transistors 57 and 67 and the drain of n-channel transistor 68 are connected to each other at a common node. Flip flop circuit 30 further includes channel region E, including a NAND gate 70 and a NOR gate 71. NAND gate 70 includes first and second inputs respectively connected to the output of inverter 34 and the drain of n-channel transistor 58. NOR gate 71 includes first and second inputs respectively connected to the output of NAND gate 70 and input, CD. The output of NOR gate 71 is connected to the input of inverter 45 in a feedback loop, which as will be discussed in detail below, is to be severed in accordance with a version of the invention to make flip flop circuit 30 acyclic. When the feedback loop is broken, first and second variables respectively S2 and S2' are inserted to enable analysis of the circuit channel which includes flip flop circuit 30 and to evaluate delays of signals propagating through flip flop circuit 30. To permit such analysis, S2 is set equal to S2'.

FIG. 3 further shows flip flop circuit 30 comprising the circuitry of channel region F including inverter 135 including a p-channel transistor 137 connected at its source to VCC, and an n-channel transistor 138 connected to VSS at its source, the respective transistors having their input control gates connected to each other at a common input node in turn connected to the output of NOR gate 71. Flip flop circuit 30 further includes inverter 145 including p-channel transistor 147 connected to VCC at its source, and n-channel transistor 148 connected to VSS at its source, the respective transistors having their input control gates connected to each other at a common input designated S1, as will be discussed in greater detail below. Flip flop circuit 30 further includes series inverters 55 and 56, the input connection for series inverter 55 being the value, CD, and the output of series inverter 55 being the value "a." Signal output values "a" and "b" having a controlling effect upon basic circuit elements of the channel region. The output of series inverter 55, i.e., "a," is connected to the input of series inverter 56. The output of series inverter 56 is the value, "b." Flip flop circuit 30 further includes a p-channel transistor 157 and n-channel transistor 158, as well as p-channel transistor 167 and n-channel transistor 168. P-channel transistor 157 is connected at its source to the drain of p-channel transistor 137, and the control gate of p-channel transistor 157 is connected to value "a," at the output of inverter 55. N-channel transistor 158 is connected at its source to the drain of n-channel transistor 138. The source of p-channel transistor 167 is connected to the drain of p-channel transistor 147, and the control gate of p-channel transistor 167 is connected to the value "a," at the output of inverter 55. The source of n-channel transistor 168 is connected to the drain of n-channel transistor 148, and the control gate of n-channel transistor 168 is connected to value "b," at the output of inverter 56. Further, the drains of p-channel transistors 157 and 167 and the drain of n-channel transistor 168 are connected to each other at a common node. Flip flop circuit 30 further includes channel region G, including a NAND gate 170 and a NOR gate 171. NAND gate 170 includes first and second inputs respectively connected to the output of inverter 134 and the drain of n-channel transistor 158. NOR gate 171 includes first and second inputs respectively connected to the output of NAND gate 170 and input, CD. The output of NOR gate 171 is connected to the input of inverter 145 in a feedback loop, which as will be discussed in detail below, is to be severed in accordance with an embodiment of the invention to make flip flop circuit 30 acyclic. When the feedback loop is broken, first and second variables respectively S1 and S1' are inserted to enable analysis of the circuit channel which includes flip flop circuit 30 and to evaluate delays of signals propagating through flip flop circuit 30. To permit such analysis, S1 is set equal to S1'. Flip flop circuit 30 further includes inverters 171 and 181 which respectively at their inputs are connected to the outputs of first, NOR gate 171, and second, the common node connected to the drains of p-channel transistors 157 and 167 and the drain of n-channel transistor 168. Inverters 180 and 181 are the only elements of respective channel regions H and I of flip flop 30.

Figure 4:
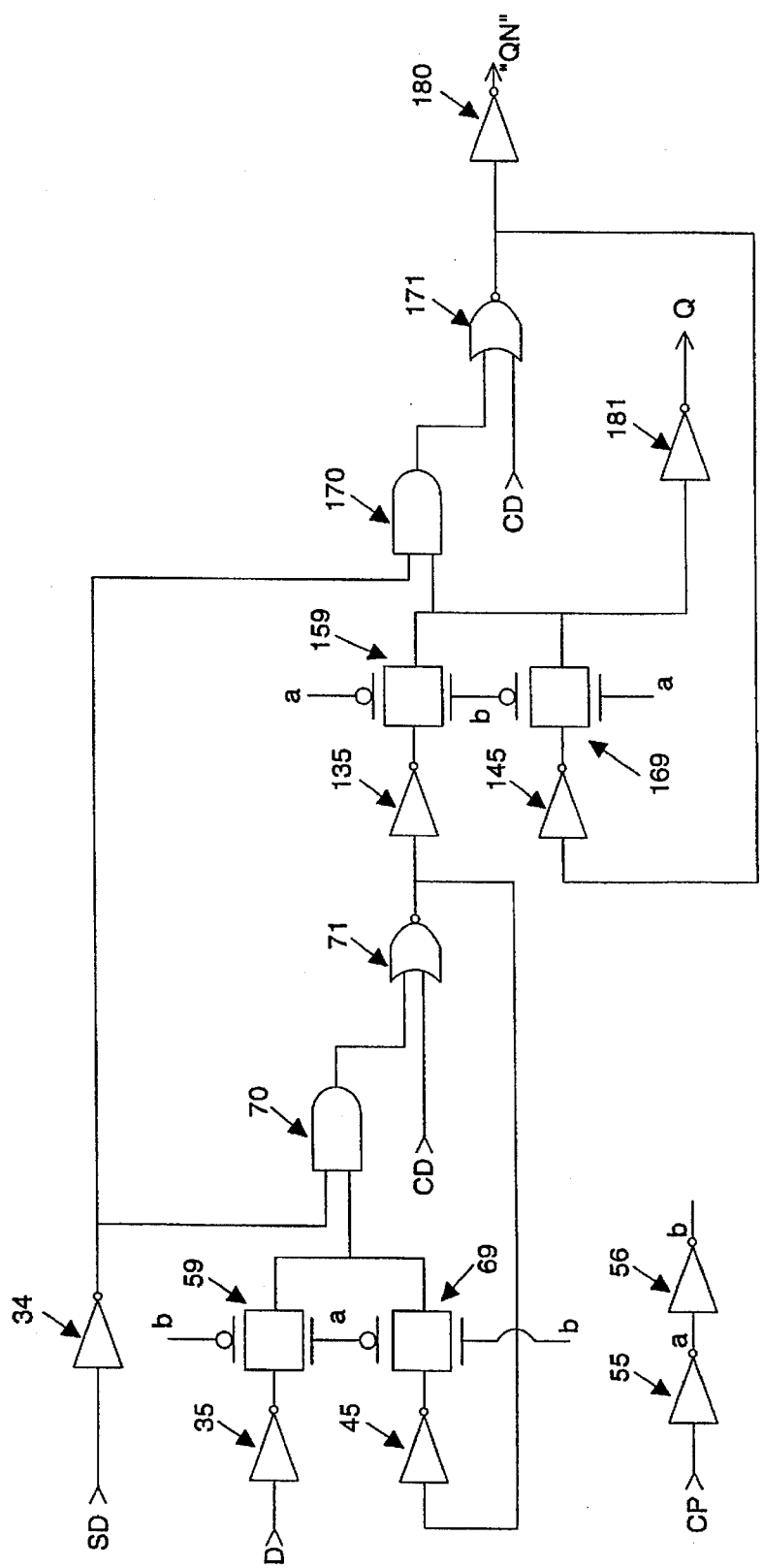
FIG. 4 shows a logic diagram representative of the transistor level circuit diagram of FIG. 3 for the flip flop leaf cell circuitry for which a delay representation is sought according to a version of the present invention.

FIG. 4 shows a logic diagram representative of the transistor level circuit diagram of FIG. 3 for the flip flop leaf cell circuitry which provides a single channel for which a delay representation is sought according to a version of the present invention. According to this higher level representation, parallel p-channel and n-channel transistors 57 and 58, 67 and 68, 137 and 138, 147 and 148, are set forth as simplified combinations 59, 69, 159, and 169, respectively.

Figure 5:
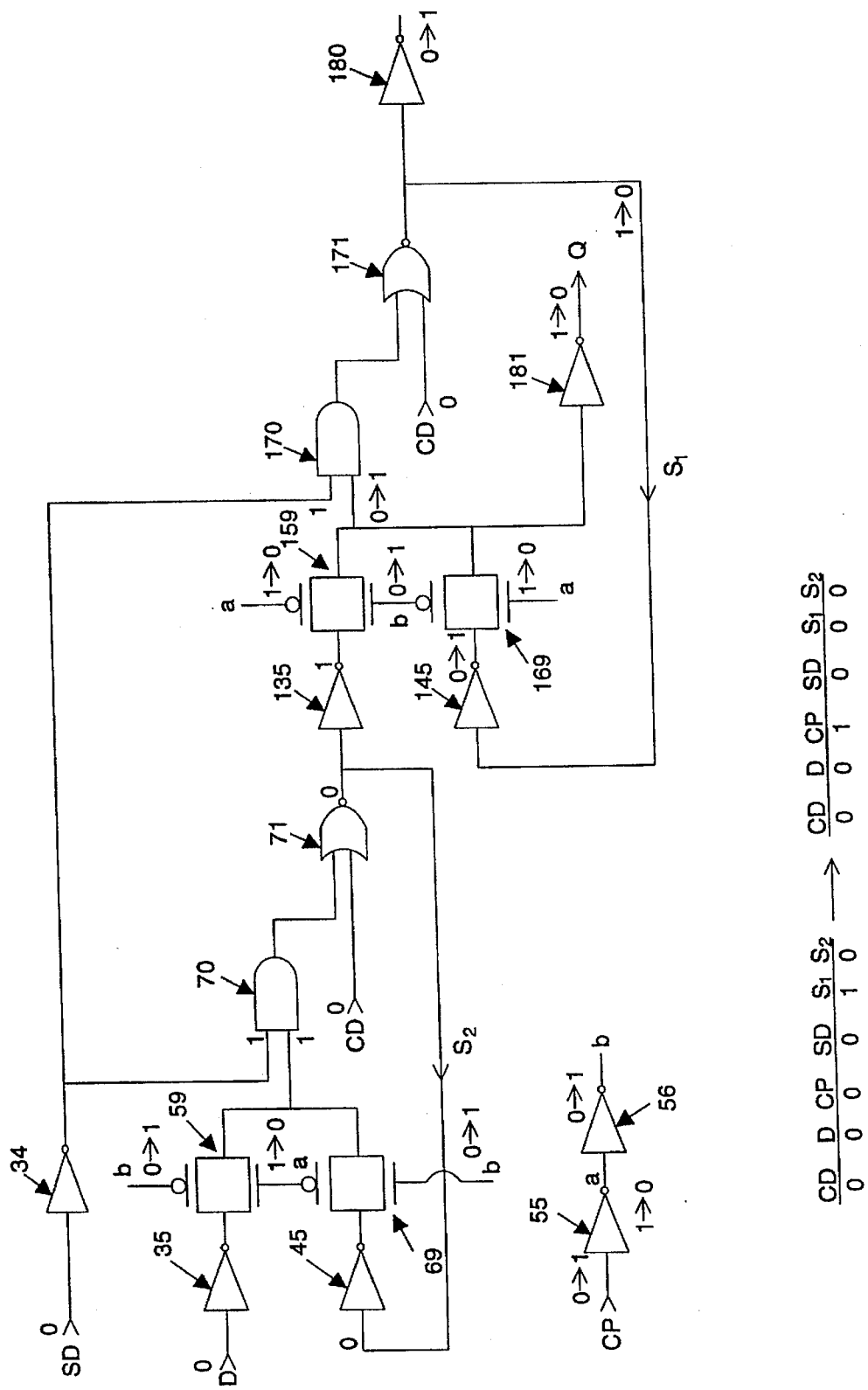
FIG. 5 shows the logic diagram of FIG. 4 tracking component state changes as input state vector (CD, D, CP, SD, S1, S2) is transformed from one state, (0, 0, 0, 0, 1, 0) to another state (0, 0, 1, 0, 0, 0)

FIG. 5 shows the logic diagram of FIG. 4 tracking component state changes as input state vector (CD, D, CP, SD, S1, S2) is transformed from one state, (0, 0, 0, 0, 1, 0) to another state (0, 0, 1, 0, 0, 0). The indicated state vector represents input and internal states. The value of state CP changes from 0 to 1, the output of inverter 55 goes from 1 to 0 and the output from inverter 56 goes from 0 to 1. Inputs CD and SD stay the same in the example of FIG. 5. That is, the input values stay 0. As noted above, the outputs of inverters 55 and 56 are represented by values "a" and "b." We have noted that the values of variables "a" and "b" have changed respectively to 0 and 1. Accordingly, the output states of inverters 145 and 180 will change from 0 to 1, as does the output of combination 159. Consequently of inverter 181 goes from 1 to 0.

Figure 6:
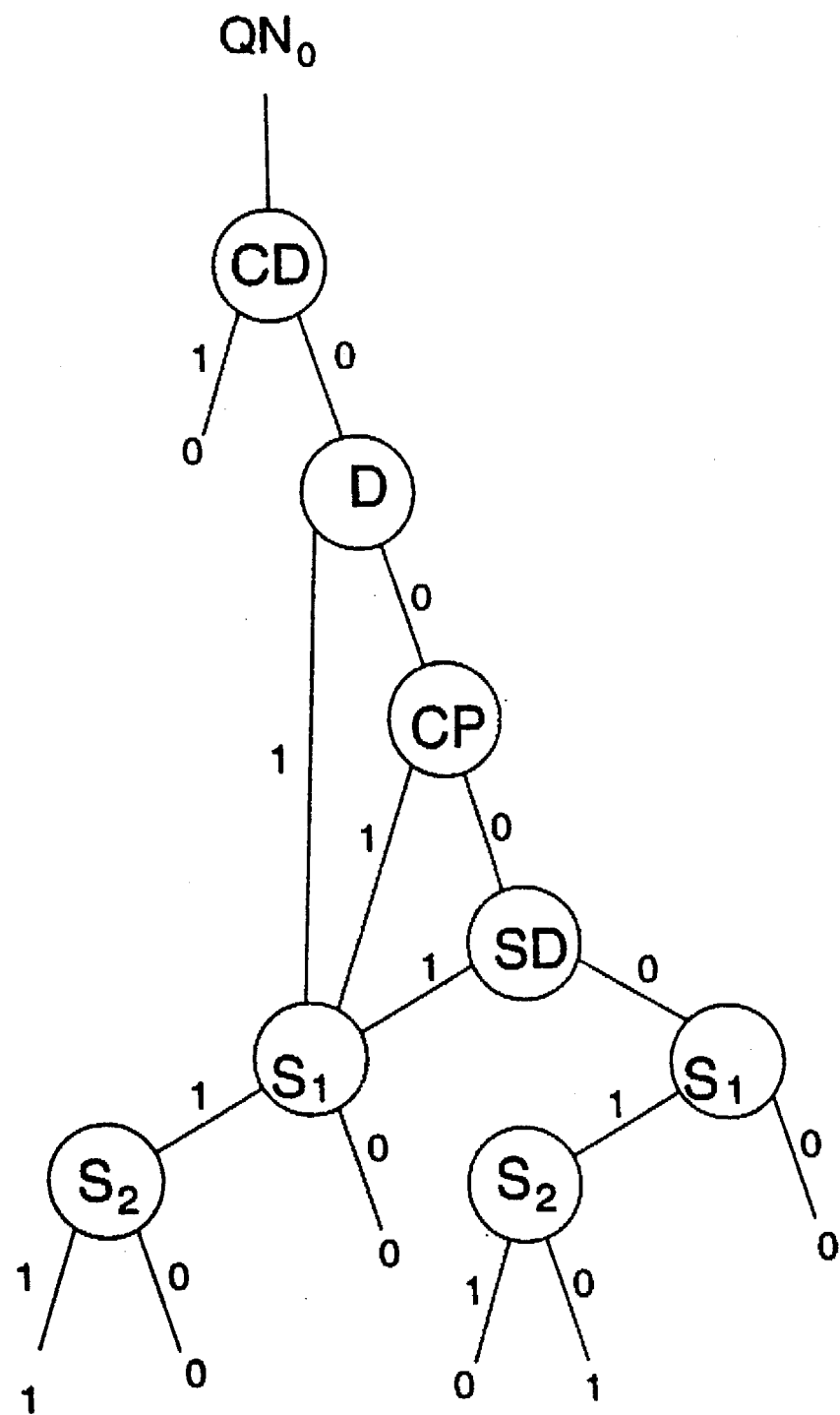
FIGS. 6 and 7 show a reduced order binary decision diagram constructed for the output pin QN equal to zero and equal to one respectively for FIG. 3 indicating system states based upon input state vector (CD, D, CP, SD, S1, S2)

FIG. 6 shows a first reduced order binary decision diagram constructed for the circuitry of FIG. 3 showing system states based upon input state vector (CD, D, CP, SD, S1, S2). In particular, the binary decision diagram expressed the conditions of the indicated inputs and states which will produce an output value of QN=0. By following different branch paths from $QN_0$ to leaf positions equal to 1, different combinations of inputs and state values will be produced which will result in a QN value which is zero.

Figure 7:
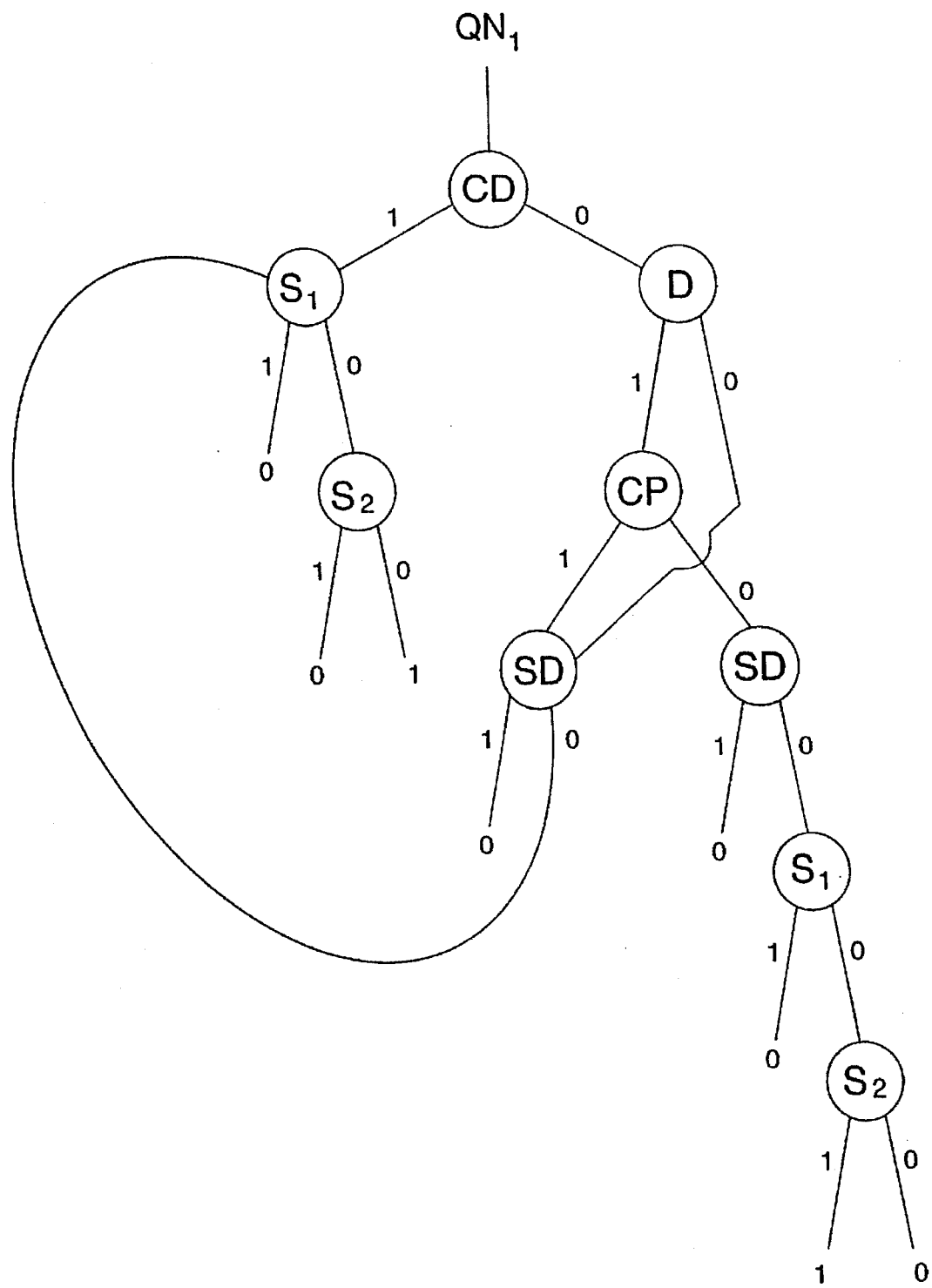

FIG. 7 shows a second reduced order binary decision diagram constructed for the circuitry of FIG. 3 showing system states based upon state vector (CD, D, CP, SD, S1, S2). In particular, the binary decision diagram expressed the conditions of the indicated inputs and states which will produce an output value of QN=1. By following different branch paths from $QN_1$ to leaf positions equal to 1, different combinations of inputs and state values will be produced which will result in a QN value which is one.

FIGS. 8a and 8b are respective tabular representations setting forth input state patterns for selected pairs of input output pins and indicating that if a selected input value CD changes its value from either 0 to 1 or 1 to 0, a selected output pin, in this case, output pin QN, will also change its value, subject to the constraint that the other inputs stay constant between FIGS. 8a and 8b. FIGS. 8c and 8c are respective tabular representations setting forth input state patterns for selected pairs of input output pins and indicating that if a selected input value CP changes its value from either 0 to 1 or 1 to 0, a selected output pin, in this case, output pin QN, will also change its value. For the example shown, switching of inputs D and SD will not affect QN.

Figure 9:
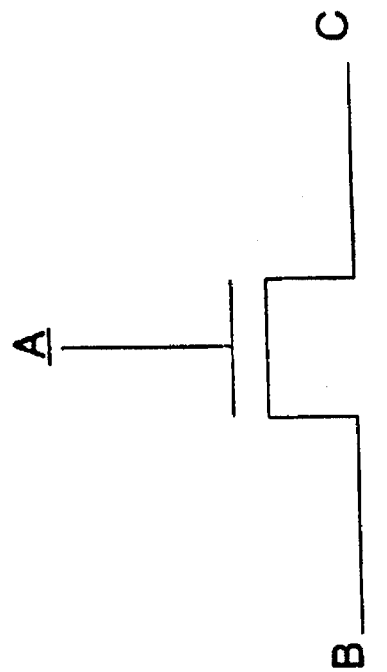
FIG. 9 shows a circuit element transformation of a p-channel transistor controlled by a control gate signal A to an n-channel transistor controlled by a control gate signal $\underline{A}$.
Figure 9:
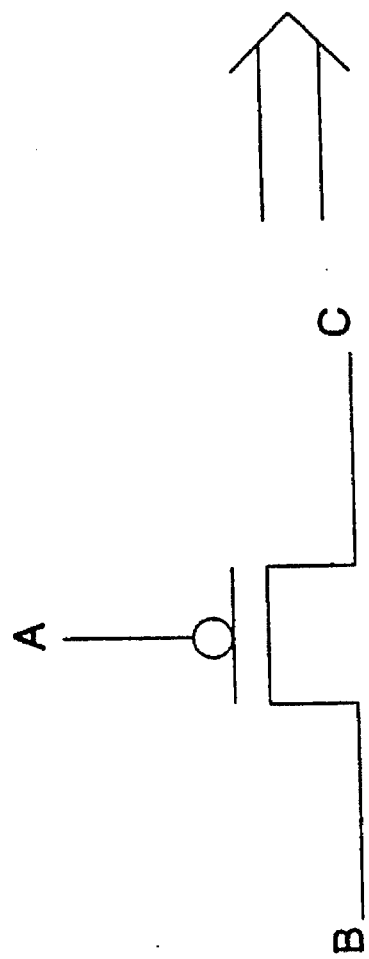

FIG. 9 shows a circuit element transformation of a p-channel transistor controlled by a control gate signal A to an n-channel transistor controlled by a control gate signal $\underline{A}$.

Figure 10:
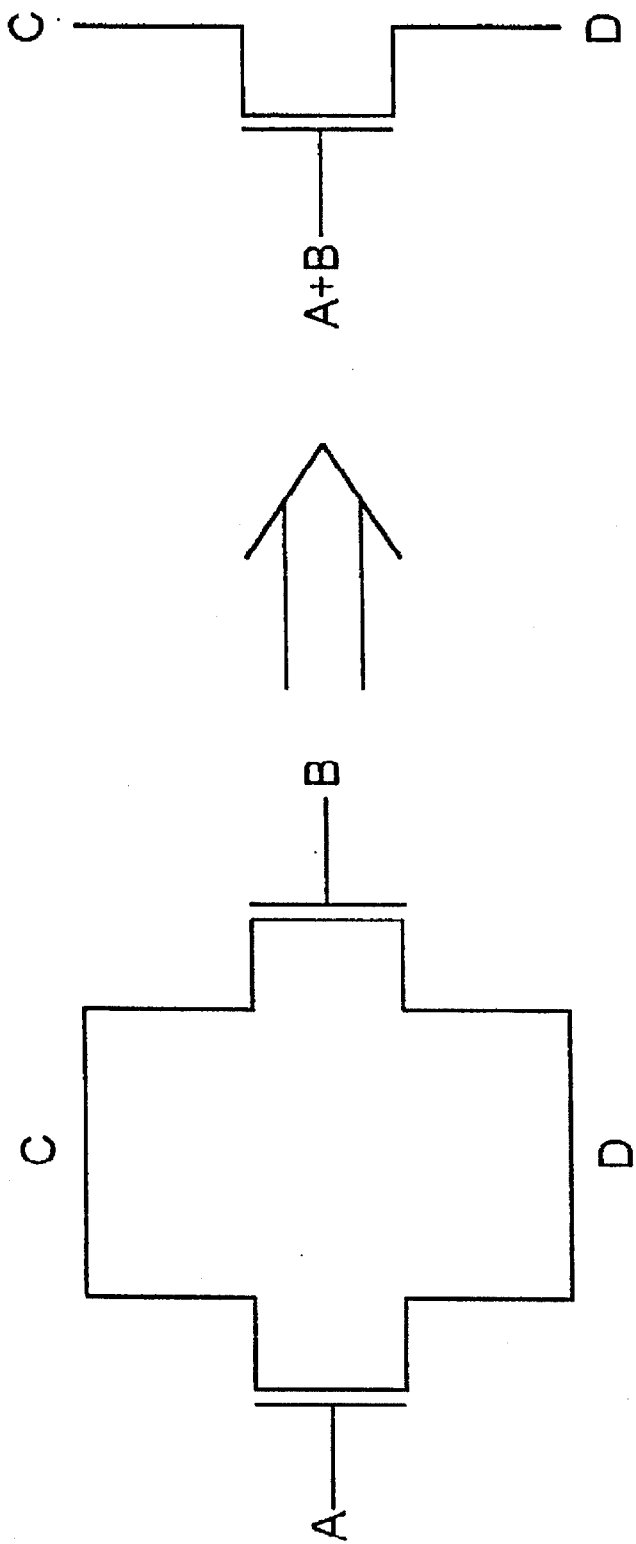
FIG. 10 shows a circuit element transformation of a pair of n-channel transistors connected in parallel, drain to drain and source to source respectively controlled by control gate signals A and B to an n-channel transistor controlled by a control gate signal A+B.

FIG. 10 shows a circuit element transformation of a pair of n-channel transistors connected in parallel, drain to drain and source to source respectively controlled by control gate signaled A and B to an n-channel transistor controlled by a control gate signal A+B.

Figure 11:
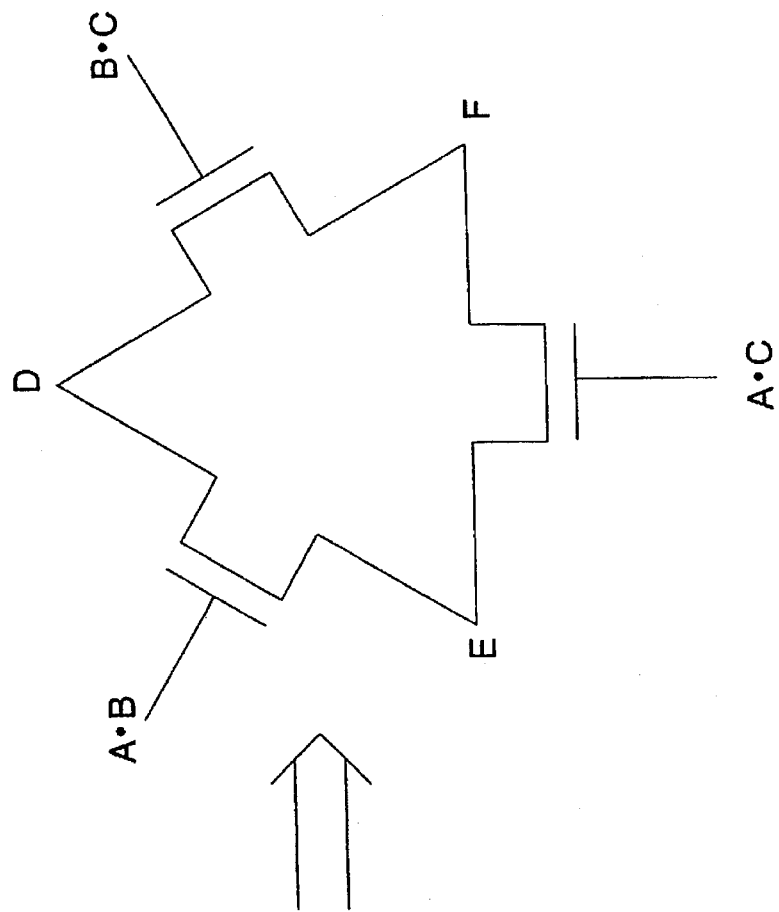
FIG. 11 shows a central node circuit combination of transistors connected at source or drain and gate controlled by respective signals A, B, and C, reconstructed to form a ring circuit combination gate controlled by respective state signals A and B, A and C, and B and C.
Figure 11:
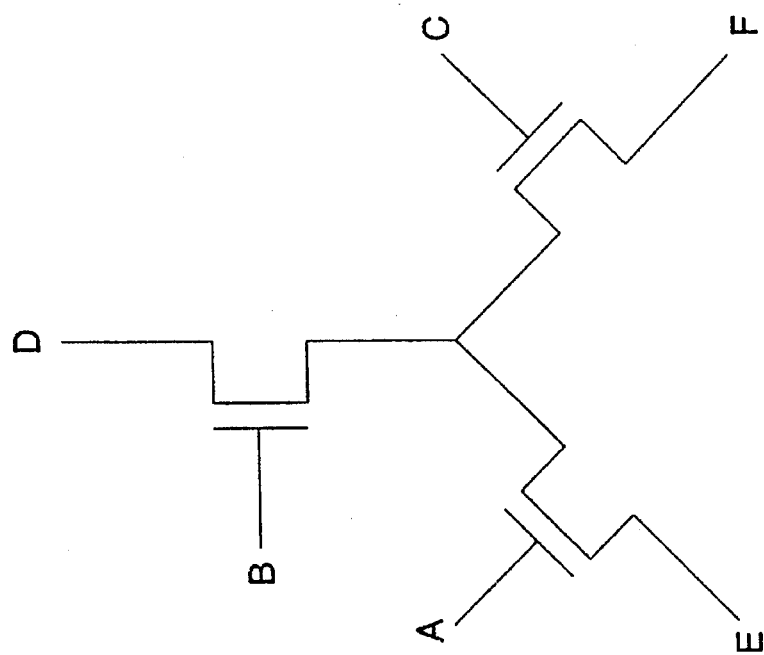

FIG. 11 shows a Y circuit combination of transistors connected at source or drain and gate controlled by respective signals A, B, and C, reconstructed to form a triangle circuit combination gate controlled by respective state signals A or B, A or C, and B or C. The Y circuit shown has three branches, but the rule applies as well to a greater number of branches. The reconstructed form is polygonal and includes gates driven by respective state signals reflecting OR combinations of all possible pairs.

Figure 12:
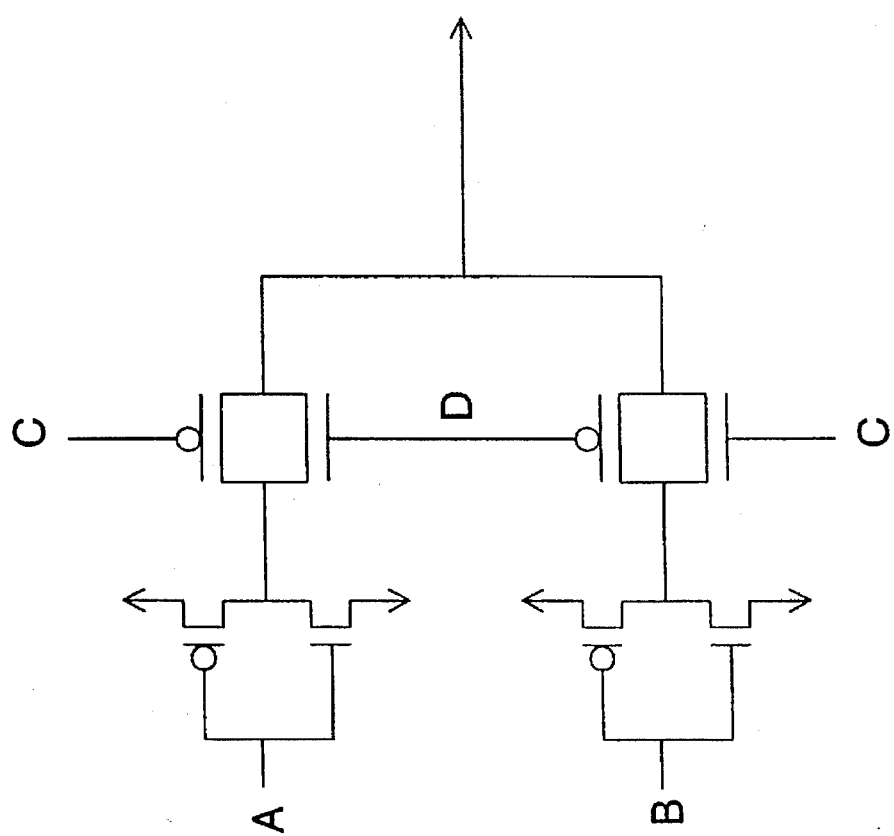
FIGS. 12 and 13 respectively show the before and after representations of a selected circuit combination in which (during the before representation) parallel p-channel and n-channel transistors having in one case the n-channel gate driven by signal D and the p-channel gate driven by signal C, and in the other case the p-channel gate driven by signal C and the n-channel gate driven by the signal D, and in which (during the after representation) the circuitry is represented by parallel single n-channel transistors respectively gate driven by signals $\underline{C}$+D and $\underline{D}$+C.
Figure 13:
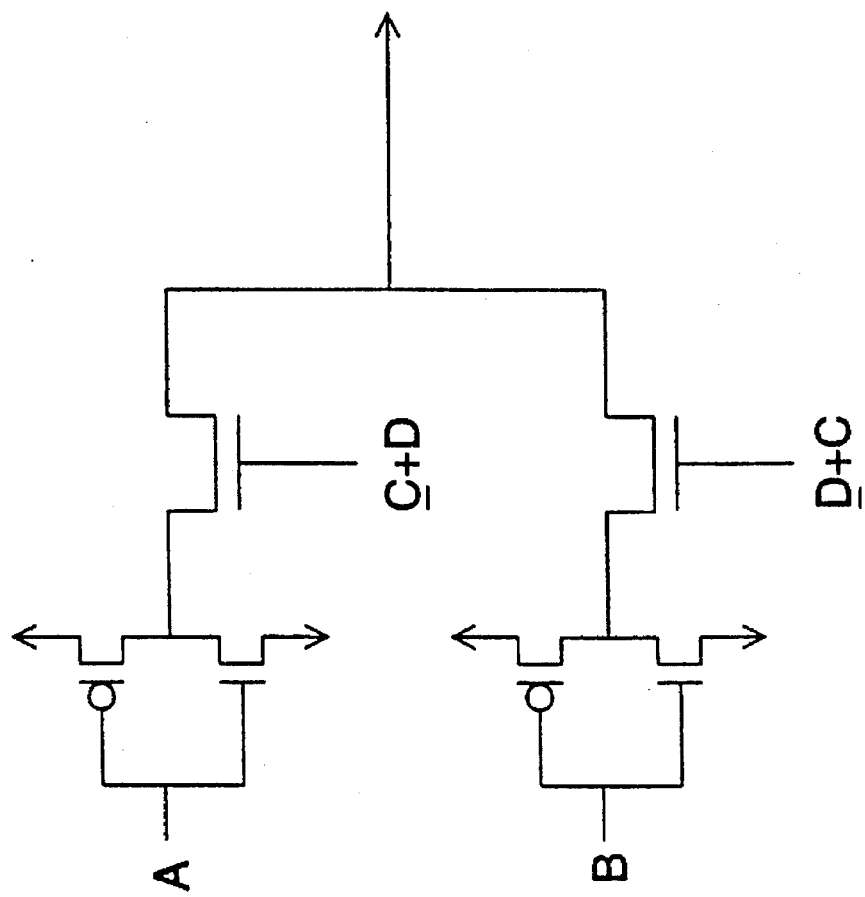

FIGS. 12 and 13 respectively show the before and after representations of a selected circuit combination in which (during the before representation) parallel p-channel and n-channel transistors having in one case the n-channel gate driven by signal D and the p-channel gate driven by signal C, and in the other case the p-channel gate driven by signal C and the n-channel gate driven by the signal D, and in which (during the after representation) the circuitry is represented by parallel single n-channel transistors respectively gate driven by signals $\underline{C}$+D and $\underline{D}$+C.

Figure 14:
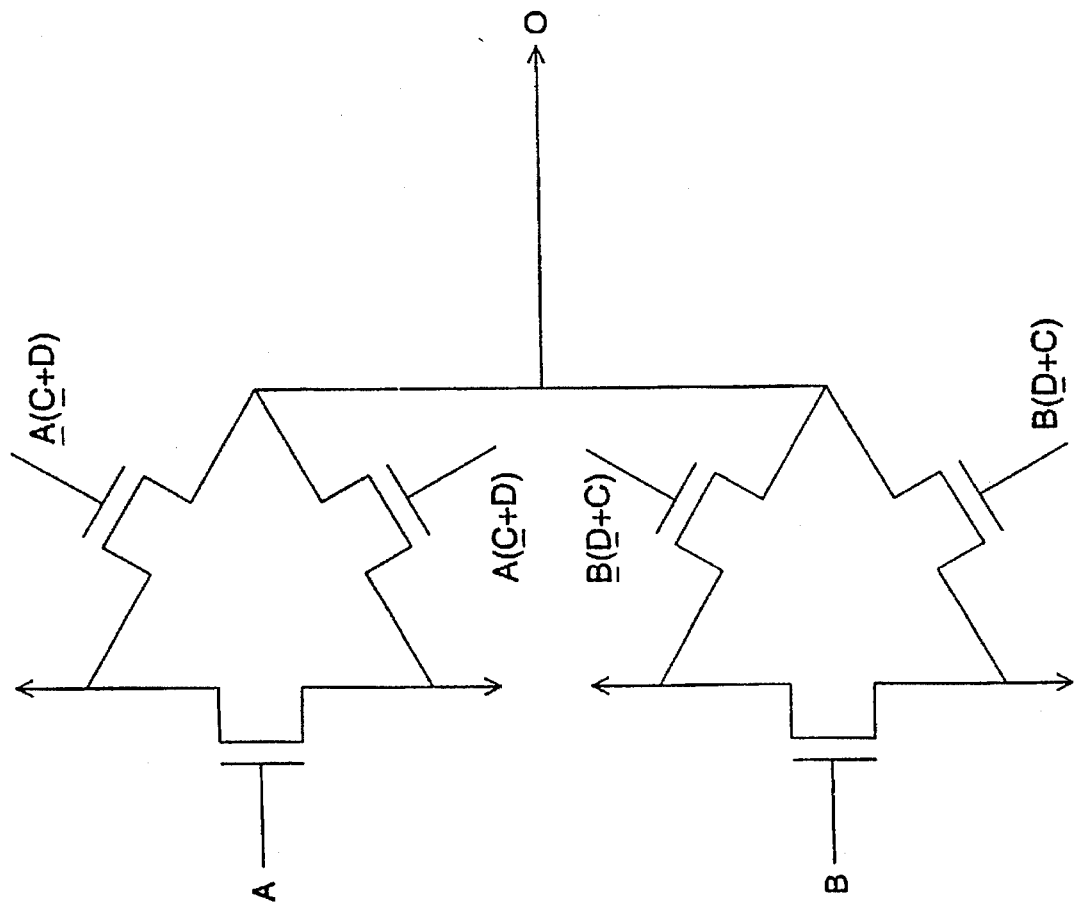
FIGS. 14 and 15 respectively show the before and after representations of a selected circuit combination in which (during the before representation) a pair of n-channel transistor rings are reduced into a two transistor, parallel n-channel configuration.
Figure 15:
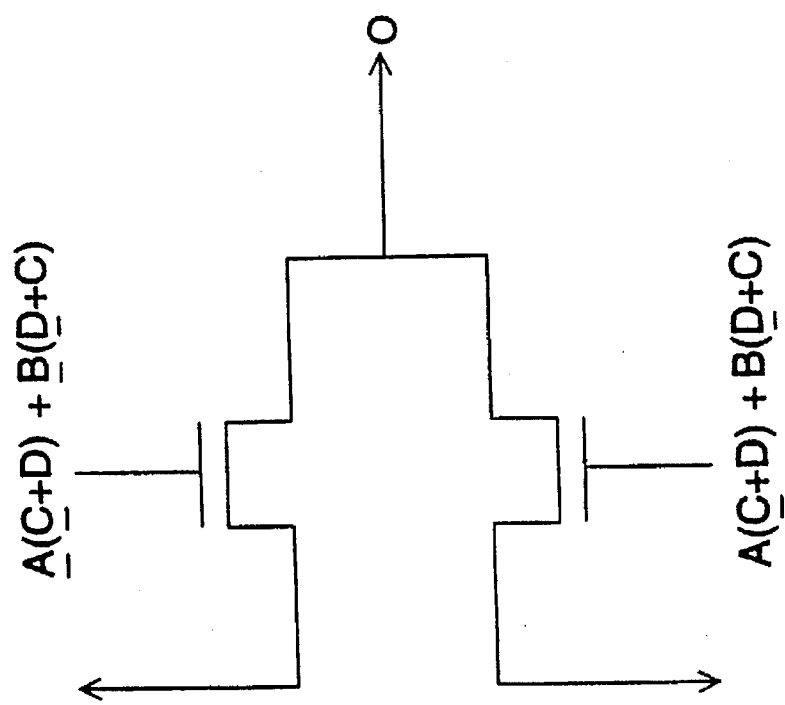

FIGS. 14 and 15 respectively show the before and after representations of a selected circuit combination in which (during the before representation) a pair of star connected sets of n-channel transistors respectively gate controlled by signals A and B for respective n-channel transistors removed from the connected output node and the side n-channel transistors of the star circuit combination are gate driven respectively by A($\underline{C}$+D) and A($\underline{C}$+D) for one star circuit combination and by B($\underline{D}$+C) and B($\underline{D}$+C), and in which (during the after representation, the circuitry is represented by first and second n-channel transistors connected in parallel and gate driven by respective signals A($\underline{C}$+D)+B($\underline{D}$+C) and A($\underline{C}$+D)+B($\underline{D}$+C).

FIG. 16a shows a number of tertiary representations of states of a variable A including 0, 1, X, and Z, which are useful in constructing binary decision diagrams. Tertiary expressions are particularly useful in representing the states of CMOS devices or combinations of devices which may have indeterminate states causes by equally compelling devices pulling a particular transistor both up and down, or not pulling a particular device either direction. Accordingly the X state can be said to be the indeterminate state in which a particular node is concurrently pulled up and down, and the Z state can be said to be the state of a node not influenced either way.

FIG. 16b shows a table of rules of reduction and the names of the reduction operators representing the particular reduction operation expressed, in particular showing features of reduction operators, AND, OR, and NOT. More particularly, the logic statement corresponding a first reduction operator, NOT, is shown being equivalent to the expression, B=$\underline{A}$. Second, the logic statement corresponding to a next reduction operator, AND, is equivalent to the expression, C=A·B. Finally, the logic statement corresponding to a last reduction operator, OR, is equivalent to the expression, C=A+B.

Figure 17:
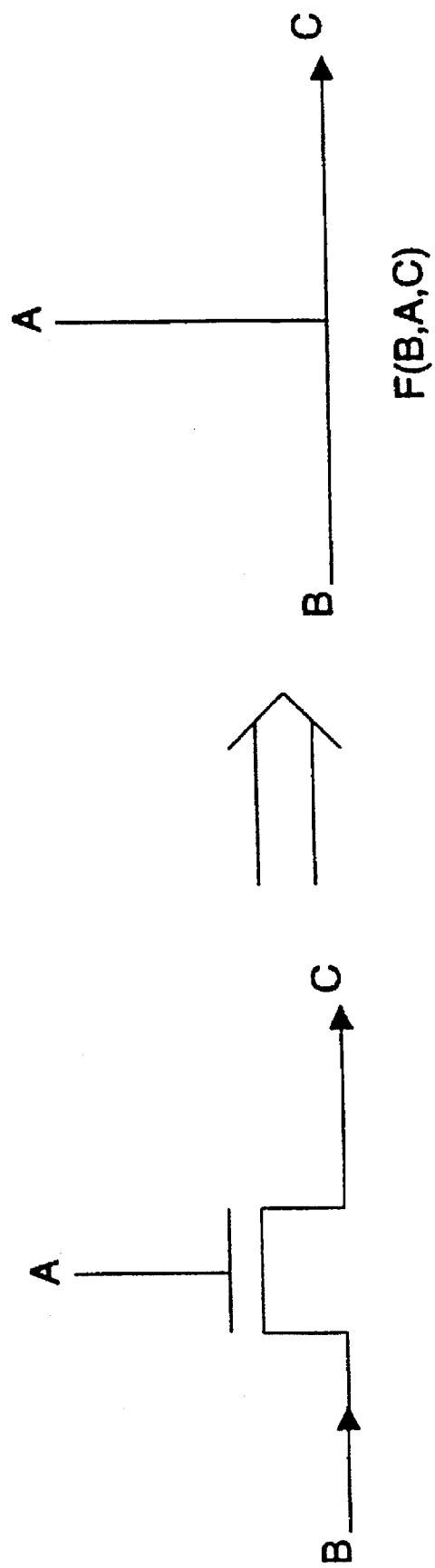
FIG. 17 shows, on the left, an n-channel transistor having a gate connection A and source and drain representations B and C, and on the right thereof, the behavior operator corresponding thereto.

FIG. 17 shows a switch reduction technique which converts the behavior of an n-channel transistor having a gate connection A and source and drain representations B and C, into an expression corresponding thereto. The four state tertiary logic representation of the indicated switch behavior operator is bifurcated into the following expressions: (1)

C·H=C·H+A·H(B·H+A·L), and (2)C·L=C·L+A·H(B·L+ A·L). This rule of reduction is supplemented by the following final rule, as an embodiment of the present invention: Initially doing a depth first traversal starting at the output node and stopping at the input node and upon the return path from the input node applying the technique of switch reduction.

Figures 18A, 18B:
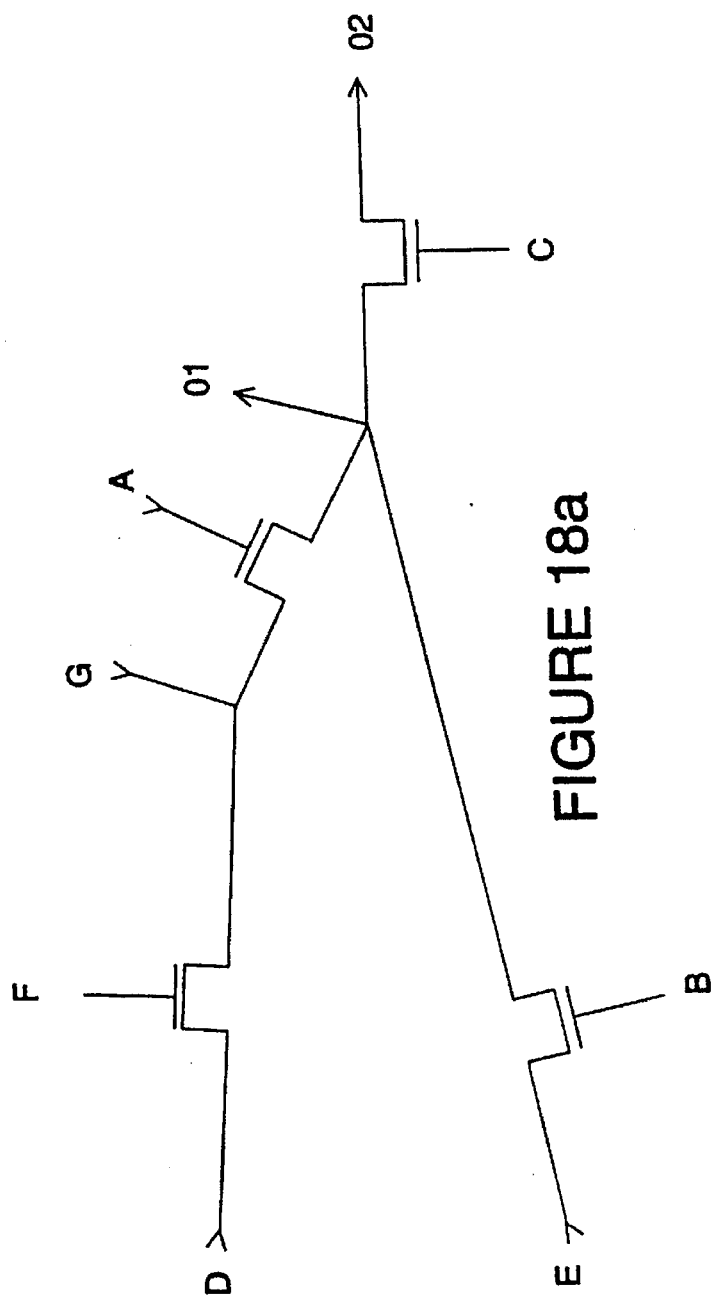
FIG. 18a show an illustration of a predetermined reduction processes to produce a simplified arrangement suitable for timing analysis under the present invention.
FIG. 18b show symbolic representations of the graphical circuit diagram shown in FIG. 18a, which is useful in developing a binary decision diagram pursuant to establishment of a tertiary expression of the indicated symbolic representation.

FIG. 18a shows the circuit of FIG. 3 reduced by parallel and series reduction processes to produce a simplified arrangement suitable for symbolic reduction under the present invention. The letters A, B, C, D, E, F and G represent inputs of the channel regions specified in FIG. 3. FIG. 18b shows the behavior operator expression form equivalent of the graphical circuit diagram shown in FIG. 18a, which is useful in developing a binary decision diagram pursuant to establishment of a tertiary expression of the indicated symbolic representation. The indicated behavior operator expression form shown is derived from the graphical circuit diagram of FIG. 18a by following the above-indicated rule of doing a depth first traversal starting at the output node and stopping at the input node and upon the return path from the input node applying the technique of switch reduction, the process by which an n-channel transistor graphical representation is converted to a behavior operator representation, in this case into a switch behavior operator. The behavior operator expression form indicated in FIG. 18b indicates that the value of output state 02 is obtained by successive evaluation of the states of the switch behavior operator functions, F(E,B,01), F(G,A,F(E,B,01)), and F[F(G,A,F(E,B,01)),C,02]. Notably, input G controls the state value at the input side of transistor G,A,O1, with the result that the behavior operator expression of FIG. 18b is independent of the state value of input variable D.

Therefore, the method of the present invention determines the location of electric leaf cell circuits within the architecture of a semiconductor chip which includes determination of the longest signal delays through an electric leaf cell circuit by evaluating independent electrical channels through the leaf cell circuit, reorganizes the circuit elements of each channel under evaluation into acyclic form, restructures the acyclic form of electric channels within the electric leaf cell circuits being structurally positioned in the chip architecture by predetermined reduction processes, determines input state vectors for each input/output pin connection pair of the electric leaf cell circuit in which an input pin connection state change is reflected in an output connection pin state change, and determines placement of the leaf cell within a semiconductor circuit module in view of the greatest delay within each leaf cell.

What is claimed is:

1. A method for determining the location of an electric leaf cell circuit to be fabricated within the architecture of a semiconductor chip, wherein the electric leaf cell circuit includes a plurality of input and output connection pins and electric circuits including circuit elements interconnected cyclically and acyclically in one or more circuit channels, the method comprising the steps of:

separating an electric leaf cell circuit into independent electrical channels, restructuring the circuit elements of each channel under evaluation into acyclic form, by opening feedback paths and inserting state variable at a selected open loop point is each feedback path which has been opened, and representing the point of opening with equal variables representing equality of value variation at the selected circuit position of the open loop which has been severed, establishing a directed graph of circuit elements of a selected channel of the electric leaf cell circuitry, including assigning input and output directions for all non-internal nodes of the channel circuitry, reducing the acyclic form of the circuit elements within a channel by series and parallel reduction, establishing input state vectors representative of the reduced acyclic form of the circuit elements in a channel of the electric leaf cell circuit, evaluating which input state vectors for particular input/output pin connection pairs of the electric leaf cell circuit are reflected in output connection pin state changes, including making an evaluation order for channel connected components, with the descendant component of the circuit components of the leaf cell being designated for priority evaluation, and further including constructing a binary decision diagram, making a determination as to the longest delay time for any input state vector in which a simple change produces an output change, obtaining a timing representation of the leaf cell and electrical connection wires of the leaf cell, and determining placement of the leaf cell within a semiconductor circuit module based upon the greatest delay within each leaf cell with reference to a timing relationship made and as actually determined based upon a comparison of plural signal paths for selected input vectors at input connections of the circuit channels of a leaf cell circuit.

2. A method for determining the location of an electric leaf cell circuit to be fabricated within the architecture of a semiconductor chip, wherein the electric leaf cell circuit includes a plurality of input and output connection pins and electric circuits including circuit elements interconnected cyclically and acyclically in one or more circuit channels, the method comprising the steps of:

separating an electric leaf cell circuit into independent electrical channels, restructuring the circuit elements of each channel under evaluation into acyclic form, by opening feedback paths and inserting state variables at a selected open loop point is each feedback path which has been opened, and representing the point of opening with equal variables representing equality of value variation at the selected circuit position of the open loop which has been severed, establishing a directed graph of circuit elements of a selected channel of the electric leaf cell circuitry, including assigning input and output directions for all non-internal nodes of the channel circuitry, establishing input state vectors representative of the reduced acyclic form of the circuit elements in a channel of the electric leaf cell circuit, evaluating which input state vectors for particular input/output pin connection pairs of the electric leaf cell circuit are reflected in output connection pin state changes, including constructing a binary decision diagram, and determining placement of the leaf cell within a semiconductor circuit with reference to the greatest delay within each leaf cell.

* * * * *